(12) United States Patent
Kuwahara et al.

(10) Patent No.: US 8,992,874 B2
(45) Date of Patent: *Mar. 31, 2015

(54) METHOD OF PRODUCING HYDRAZINE-COORDINATED CU CHALCOGENIDE COMPLEX

(75) Inventors: Masaru Kuwahara, Hillsboro, OR (US); Koichi Misumi, Hillsboro, OR (US); Hidenori Miyamoto, Hillsboro, OR (US)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 39 days.

This patent is subject to a terminal disclaimer.

(21) Appl. No.: 13/611,499

(22) Filed: Sep. 12, 2012

(65) Prior Publication Data

US 2014/0072500 A1    Mar. 13, 2014

(51) Int. Cl.
C01G 3/12    (2006.01)
C01B 21/092    (2006.01)
C01B 19/00    (2006.01)

(52) U.S. Cl.
CPC ............. C01B 21/092 (2013.01); C01G 3/12 (2013.01); C01B 19/002 (2013.01)
USPC ............................. 423/413; 423/23; 423/508

(58) Field of Classification Search
CPC ........ C01G 3/00; C01G 3/006; C01B 19/002; C01B 19/007; C01B 21/086; C01B 21/092; C01B 21/093; C01B 21/16; C01B 19/04; C01B 21/0625; C09K 11/88; C09K 11/881; C09K 11/582; H01L 31/0322
See application file for complete search history.

(56) References Cited

U.S. PATENT DOCUMENTS

| 7,094,651 | B2 | 8/2006 | Mitzi et al. | |
| 7,517,718 | B2 | 4/2009 | Mitzi et al. | |
| 2005/0158909 | A1* | 7/2005 | Milliron et al. | 438/85 |
| 2008/0148904 | A1 | 6/2008 | Tomonari et al. | |
| 2011/0008927 | A1* | 1/2011 | Huang et al. | 438/95 |

FOREIGN PATENT DOCUMENTS

| CN | 101471394 A * | 7/2009 |
| CN | 101780993 A | 7/2010 |
| WO | WO 2008/057119 A1 | 5/2008 |
| WO | WO 2008/063190 A2 | 5/2008 |

OTHER PUBLICATIONS

Zheng et al, "Facile synthesis and phase control of copper chalcogenides with different morphologies" (2008), Applied Physics A, vol. 94, pp. 805-812.*
Final Office Action in U.S. Appl. No. 13/157,885 dated Nov. 6, 2014.

* cited by examiner

*Primary Examiner* — Anthony J Zimmer
*Assistant Examiner* — Justin Bova
(74) *Attorney, Agent, or Firm* — Knobbe Martens Olson & Bear LLP

(57) ABSTRACT

A method of producing a hydrazine-coordinated Cu chalcogenide complex, including: a step (I) in which Cu or $Cu_2Se$ and a chalcogen are reacted in dimethylsulfoxide in the presence of hydrazine, a step (II) in which a solution obtained in the step (I) is subjected to concentration and filtration, and a step (III) in which a purifying solvent is added to a solution obtained in the step (II).

6 Claims, 2 Drawing Sheets

US 8,992,874 B2

METHOD OF PRODUCING HYDRAZINE-COORDINATED CU CHALCOGENIDE COMPLEX

TECHNICAL FIELD

The present invention relates to a method of producing a hydrazine-coordinated Cu chalcogenide complex.

DESCRIPTION OF RELATED ART

In recent years, in consideration of environment, solar cells have been attracting a growing interest. In particular, attention has been drawn to chalcopyrite solar cells which are thin-film solar cells with high photoelectric conversion efficiency, and also CZTS solar cells which have a rare metal such as indium used in a chalcopyrite solar cell substituted with another element, and hence, research and development have been actively conducted.

A chalcopyrite solar cell is produced by forming a light absorbing layer prepared from a chalcopyrite material on a substrate. Representative elements of a chalcopyrite material include copper (Cu), indium (In), gallium (Ga), selenium (Se) and sulfur (S), and representative examples of a light absorbing layer include $Cu(In, Ga)Se_2$ and $Cu(In, Ga)(Se, S)_2$, which are abbreviated as CIGS and CIGSS, respectively. Recently, CZTS solar cell has been studied in which a rare metal indium has been substituted and is composed of, for example, copper (Cu), zinc (Zn), tin (Sn), selenium (Se) and sulfur (S). Representative examples of the light absorbing layer of such a solar cell include $Cu_2ZnSnSe_4$, $Cu_2ZnSnS_4$ and $Cu_2ZnSn(S, Se)_4$.

FIG. 1 is a schematic cross-sectional diagram of an example of a chalcopyrite solar cell or a CZTS solar cell.

As shown in FIG. 1, a chalcopyrite solar cell or a CZTS solar cell 1 has a basic structure in which a first electrode 3, a CIGS or CZTS layer 4, a buffer layer 5, an i-ZnO layer 6 and a second electrode 7 are laminated on a substrate 2 in this order. As the buffer layer, for example, a CdS layer, an ZnS layer and an InS layer are known.

Each of the first electrode 3 and the second electrode 7 has a terminal connected thereto, and each of the terminals is connected to a wiring. In such a chalcopyrite solar cell or a CZTS solar cell 1, an incident light entering in the direction of A is absorbed by the CIGS or CZTS layer 4 to generate an electromotive force, and an electric current flows in the direction of B.

The surface of the second electrode 7 is, for example, covered with an anti-reflection film layer 8 composed of an $MgF_2$ layer for protection.

As a method of forming a CIGS or CZTS layer 4, a sputtering method and a coating method are known. However, in the sputtering method, the size of the apparatus tends to be scaled up, thereby deteriorating the yield. Therefore, diligent studies have been made on the coating method which enables production at a relatively low cost.

Generally, in a coating method of a CIGS layer, elements such as Cu, In, Ga, Se and S are dissolved in a specific solvent to prepare a coating solution, and the coating solution is applied to a substrate by a spin coating method or a dipping method, followed by baking, thereby forming a CIGS layer (see for example, Patent Document 1 and Patent Document 2).

In the preparation of a coating solution, there are known a method in which hydrazine is used as the solvent, and a method in which amine is added as a dissolution promoter instead of using hydrazine.

DOCUMENTS OF RELATED ART

Patent Document

[Patent Document 1] U.S. Pat. No. 7,094,651
[Patent Document 2] WO2008/057119
[Patent Document 3] WO2008/063190
[Patent Document 4] U.S. Pat. No. 7,517,718

SUMMARY OF THE INVENTION

However, in the preparation of a coating solution, when hydrazine is used as the solvent, a problem has conventionally been raised in terms of safety of the process due to chemical properties (explosiveness) of hydrazine.

Further, when hydrazine is used as the coating solvent, a problem arises in that copper selenide ($Cu_2Se$) is precipitated after about 2 weeks from the preparation of the coating solution, such that the storage period of the coating solution becomes short.

In view of these problems, there have been demands for a coating solution which can assure safety of process and have storage stability over a long time. However, such a coating solution has not been proposed under these circumstances.

For solving the above-mentioned problems, the present invention employs the following embodiments.

Specifically, a method of producing a hydrazine-coordinated Cu chalcogenide complex according to a first aspect of the present invention includes: a step (I) in which Cu or $Cu_2Se$ and a chalcogen are reacted in dimethylsulfoxide in the presence of hydrazine, a step (II) in which a solution obtained in the step (I) is subjected to concentration and filtration, and a step (III) in which a purifying solvent is added to a solution obtained in the step (II).

Further, a method of producing a hydrazine-coordinated Cu chalcogenide complex according to a second aspect of the present invention includes: a step (I') in which Cu or $Cu_2Se$ and a chalcogen are reacted in dimethylsulfoxide in the presence of hydrazine, a step (II') in which a poor solvent is added to a solution obtained in the step (I') to thereby precipitate a crude hydrazine-coordinated Cu chalcogenide complex, a step (III') in which the crude hydrazine-coordinated Cu chalcogenide complex obtained in the step (II') is mixed with dimethylsulfoxide, and a step (IV') in which a purifying solvent is added to a solution obtained in the step (III').

In the present invention, a hydrazine-coordinated Cu chalcogenide complex is provided which is usable for forming a light-absorbing layer of a chalcopyrite solar cell or a CZTS solar cell. Therefore, when coating is performed in the formation of a light-absorbing layer of a chalcopyrite solar cell or a CZTS solar cell, there is no need to use dangerous hydrazine in the application of the coating solution. As a result, safety of the process in the formation of a light-absorbing layer can be assured. Further, a hydrazine-coordinated Cu chalcogenide complex produced by the present invention has no precipitation of $Cu_2Se$. Therefore, the coating solution exhibits an excellent storage stability.

DETAILED DESCRIPTION OF THE INVENTION

Figure 1:
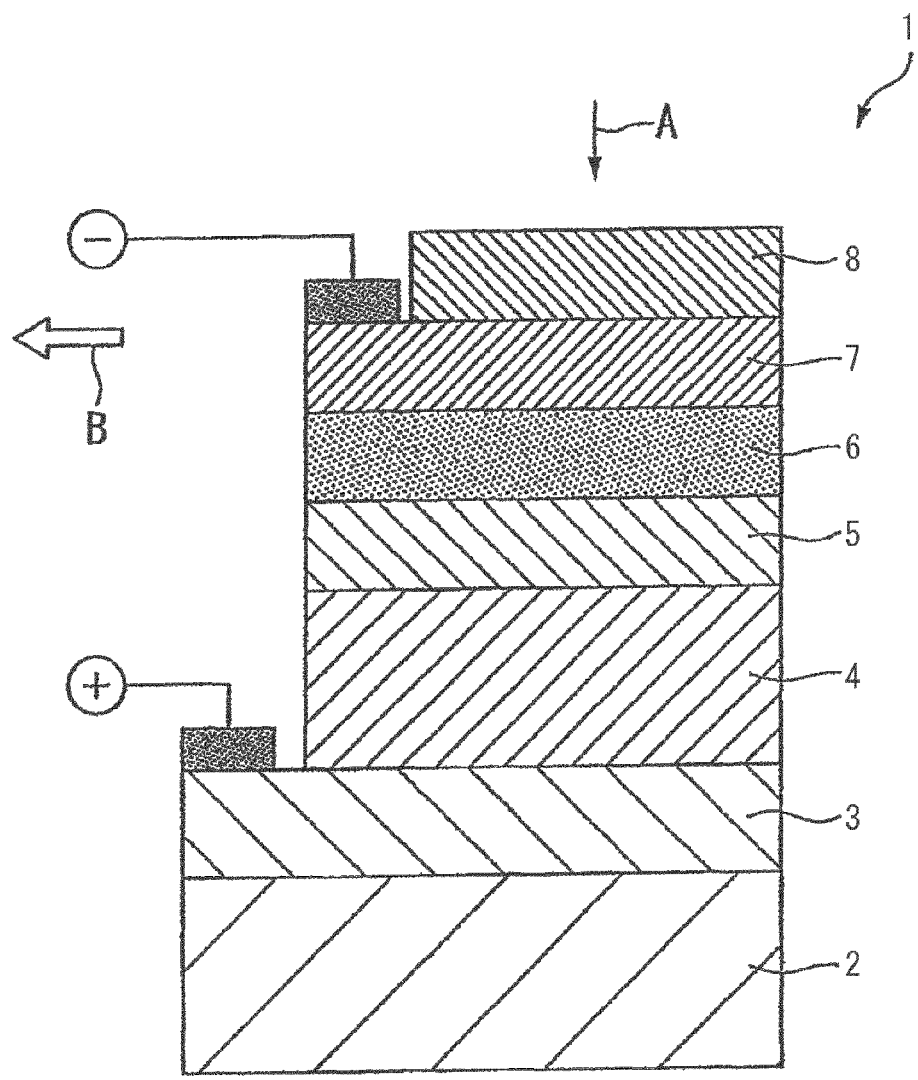
FIG. 1 is a schematic cross-sectional diagram of an example of a chalcopyrite solar cell or a CZTS solar cell.

Method of Producing a Hydrazine-Coordinated Cu Chalcogenide Complex

Hereinbelow, the method of producing a hydrazine-coordinated Cu chalcogenide complex according to the present invention will be described.

<First Aspect>

The method of producing a hydrazine-coordinated Cu chalcogenide complex according to the first aspect of the present invention (hereafter, sometimes referred to as "first production method") includes: a step (I) in which Cu or Cu$_2$Se and a chalcogen are reacted in dimethylsulfoxide in the presence of hydrazine, a step (II) in which a solution obtained in the step (I) is subjected to concentration and filtration, and a step (III) in which a purifying solvent is added to a solution obtained in the step (II).

More specifically, for example, in the first production method, a Cu metal and 2 to 4 equivalents of Se are reacted in dimethylsulfoxide (DMSO) in the presence of hydrazine, and stirred at room temperature for about 3 to 7 days (step (I)). Thereafter, the remaining hydrazine is preferably removed under reduced pressure, followed by concentration, and subjecting the obtained concentrated solution to filtration (step (II)). Further, a purifying solvent is added to the solution obtained in the step (II) (step (TIM, thereby producing a hydrazine-coordinated Cu—Se complex/DMSO solution.

As the purifying solvent, at least one member selected from the group consisting of water and an alcohol of 1 to 5 carbon atoms is preferable.

As water, pure water is preferable.

Examples of the alcohol of 1 to 5 carbon atoms include methanol, ethanol, isopropanol (IPA), n-butyl alcohol, sec-butyl alcohol, isobutyl alcohol, tert-butyl alcohol, 1-pentanol, 2-pentanol, 3-pentanol, 2-methyl-1-butanol, 3-methyl-1-butanol, 2-methyl-2-butanol, 3-methyl-2-butanol, 2,2-dimethyl-1-propanol, ethylene glycol and glycerin. Among these, methanol, ethanol and isopropanol (IPA) are preferable.

As the purifying solvent, at least one member selected from the group consisting of water, methanol, ethanol and isopropanol (IPA) is preferable, and pure water is most preferable.

The amount of the purifying solvent added in terms of volume ratio of the solution obtained in the step (II): the purifying solvent is preferably from 90:10 to 20:80, more preferably from 80:20 to 40:60, and still more preferably from 60:40 to 40:60.

As the chalcogen, Se or S can be used, and Se is preferable. As Cu, not only a Cu metal, but also copper selenide (Cu$_2$Se) may be used.

As hydrazine, anhydrous hydrazine may be used, although hydrazine monohydrate or hydrazine containing water (hereafter, referred to as "water-containing hydrazine") is preferable. Anhydrous hydrazine vigorously reacts with selenium, whereas hydrazine monohydrate or a water-containing hydrazine mildly reacts with selenium. Therefore, hydrazine monohydrate or a water-containing hydrazine is preferable in terms of ease in handling in the synthesis process. The water content of the water-containing hydrazine is preferably 63% by weight or more.

Further, in the first aspect, in the step (I), it is preferable to react Cu or Cu$_2$Se and a chalcogen in dimethylsulfoxide in the presence of hydrazine and free of an amine solvent.

Here, an "amine solvent" includes ammonia, tetramethylammonium hydroxide, nitrogen-containing organic compounds and the like. However, in the present invention, hydrazine is not included in "amine solvent".

With respect to the amount of Cu and the chalcogen, it is preferable to use 2 to 4 mol of the chalcogen, per 1 mol of Cu. Further, it is preferable to dissolve Cu and the chalcogen in DMSO having about 2 mol of hydrazine added thereto.

The generation of the hydrazine-coordinated Cu chalcogenide complex described above can be expressed by a chemical formula (I) shown below.

[Chemical Formula 1]

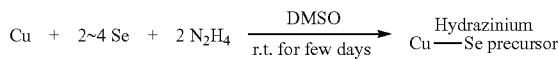

(1)

$$Cu\ +\ 2\sim4\ Se\ +\ 2\ N_2H_4\ \xrightarrow[\text{r.t. for few days}]{\text{DMSO}}\ \underset{\text{Cu---Se precursor}}{\text{Hydrazinium}}$$

<Second Aspect>

The method of producing a hydrazine-coordinated Cu chalcogenide complex according to the second aspect of the present invention (hereafter, sometimes referred to as "second production method") includes: a step (I') in which Cu or Cu$_2$Se and a chalcogen are reacted in dimethylsulfoxide in the presence of hydrazine, a step (II') in which a poor solvent is added to a solution obtained in the step (I') to thereby precipitate a crude hydrazine-coordinated Cu chalcogenide complex, a step (III') in which the crude hydrazine-coordinated Cu chalcogenide complex obtained in the step (II') is mixed with dimethylsulfoxide, and a step (IV') in which a purifying solvent is added to a solution obtained in the step (III').

More specifically, for example, in the second production method, a Cu metal and a chalcogen are reacted in DMSO in the presence of hydrazine, and stirred at room temperature for about 3 to 7 days (step (I')). Thereafter, preferably, hydrazine is removed from the obtained solution while flowing nitrogen, followed by filtration. Then, a poor solvent is added to the filtrate to perform a recrystallization, thereby precipitating a black, crude hydrazine-coordinated Cu chalcogenide complex (step (II')). Further, the crude hydrazine-coordinated Cu chalcogenide complex obtained in the step (II') is mixed with DMSO (step (III')). Subsequently, a purifying solvent is added to the solution obtained in the step (III') (step (IV')), thereby producing a hydrazine-coordinated Cu—Se complex/DMSO solution.

As the purifying solvent, the same purifying solvents as those described above in the first aspect can be used.

The amount of the purifying solvent added in terms of volume ratio of the solution obtained in the step (III'): the purifying solvent is preferably from 90:10 to 20:80, more preferably from 80:20 to 40:60, and still more preferably from 60:40 to 40:60.

As the chalcogen, the same chalcogens as those described above in the first aspect can be used.

As the poor solvent, at least one member selected from the group consisting of alcohols of 1 to 5 carbon atoms is preferable. Examples of the alcohols of 1 to 5 carbon atoms include methanol, ethanol, isopropanol (IPA), n-butyl alcohol, sec-butyl alcohol, isobutyl alcohol, tert-butyl alcohol, 1-pentanol, 2-pentanol, 3-pentanol, 2-methyl-1-butanol, 3-methyl-1-butanol, 2-methyl-2-butanol, 3-methyl-2-butanol, 2,2-dimethyl-1-propanol, ethylene glycol and glycerin. Among these, methanol, ethanol and isopropanol (IPA) are preferable, and isopropanol (IPA) is most preferable.

The crude hydrazine-coordinated Cu chalcogenide complex obtained in the step (II') refers to a different product from the hydrazine-coordinated Cu chalcogenide complex obtained in the step (IV') as a final product.

As hydrazine, anhydrous hydrazine may be used, although hydrazine monohydrate or hydrazine containing water (hereafter, referred to as "water-containing hydrazine") is preferable. Anhydrous hydrazine vigorously reacts with selenium, whereas hydrazine monohydrate or a water-containing hydrazine mildly reacts with selenium. Therefore, hydrazine monohydrate or a water-containing hydrazine is preferable in terms of ease in handling in the synthesis process. The water content of the water-containing hydrazine is preferably 63% by weight or more.

Further, in the second aspect, in the step (I'), it is preferable to react Cu or $Cu_2Se$ and a chalcogen in dimethylsulfoxide in the presence of hydrazine and free of an amine solvent.

Here, the "amine solvent" is the same as defined in the aforementioned first aspect.

With respect to the amount of Cu and the chalcogen, it is preferable to use 2 to 4 mol of the chalcogen, per 1 mol of Cu. Further, it is preferable to dissolve Cu and the chalcogen having about 2 mol of hydrazine added thereto.

The generation of the hydrazine-coordinated Cu chalcogenide complex described above can be expressed by the aforementioned chemical formula (I).

As described above, in the second production method, a crude Cu chalcogenide complex is obtained by dissolving Cu or $Cu_2Se$ and a chalcogen in a DMSO solution, followed by recrystallization. As a result, the thus obtained crude hydrazine-coordinated Cu chalcogenide complex is extremely soluble in a DMSO solution.

Further, with respect to a hydrazine-coordinated Cu chalcogenide complex obtained by the first production method or the second production method, since the coating solvent does not contain hydrazine, the chemical properties (explosiveness) of hydrazine in the formation of a light-absorbing layer would not be of any problems, thereby improving the safety of the production process.

Furthermore, in the method of producing a hydrazine-coordinated Cu chalcogenide complex according to the present invention, by virtue of adding a purifying solvent, unreacted Se and impurities derived from Cu can be precipitated. The precipitate can be removed, for example, by filtration. It is presumed that the unreacted Se and the impurities derived from Cu affects the photoelectric conversion efficiency in the case of forming a light absorbing layer. Therefore, with respect to a hydrazine-coordinated Cu chalcogenide complex obtained by the method of the present invention, since the unreacted Se and the impurities derived from Cu have been removed, when a light absorbing layer is formed, it is expected that the photoelectric conversion efficiency can be improved.

For the reasons as described above, a hydrazine-coordinated Cu chalcogenide complex obtained by the method of the present invention is extremely useful as a Cu component of a coating solution for forming a CIGS or CZTS layer.

Coating Solution for Forming CZTS Layer

Hereinbelow, the coating solution for forming a CZTS layer according to the present embodiment will be described.

The coating solution of the present embodiment which is used for forming a CZTS layer is obtained by dissolving a hydrazine-coordinated Cu chalcogenide complex component (A), a hydrazine-coordinated Sn chalcogenide complex component (B) and a hydrazine-coordinated Zn chalcogenide complex component (C) in dimethylsulfoxide (DMSO).

The coating solution forming a light-absorbing layer is preferably free of amine solvents.

As the hydrazine-coordinated Cu chalcogenide complex component (A), a hydrazine-coordinated Cu chalcogenide complex obtained by the aforementioned first or second method can be used.

Next, the hydrazine-coordinated Sn chalcogenide complex component (B) will be described. The hydrazine-coordinated Sn chalcogenide complex component (B) used in this embodiment is required to be generated so as to be soluble in DMSO. The hydrazine-coordinated Sn chalcogenide complex can be generated, for example, by adding Sn metal and a chalcogen in hydrazine to obtain a crude product. Extracting the crude product with DMSO, adding a poor solvent to the resulting solution, followed by reprecipitation.

More specifically, Sn metal and a chalcogen are added to hydrazine, and stirred at room temperature for about 1 to 3 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter, followed by concentration. Then, a poor solvent is added to the concentration solution to perform a reprecipitation, and the supernatant is removed. The precipitate is washed with IPA and dried, thereby obtaining a dark-yellow hydrazine-coordinated Sn chalcogenide complex.

Alternatively, the hydrazine-coordinated Sn chalcogenide complex component (B) can be prepared as follows. A metal Sn and 3 equivalents of Se are stirred in hydrazine (5 ml) at room temperature for 1 to 3 days. Then, IPA is added and stiffed, and a yellow product is precipitated. The supernatant is removed, and the precipitate is washed with IPA and dried, thereby obtaining a crude product.

Subsequently, the crude product is subjected to extraction with DMSO (80° C., 1 hr), followed by concentration. The resulting concentrated solution is subjected to filtration, thereby obtaining a hydrazine-coordinated Sn—Se chalcogenide complex/DMSO solution.

The generation of the hydrazine-coordinated Sn chalcogenide complex described above can be expressed by a chemical formula (2) shown below.

[Chemical Formula 2]

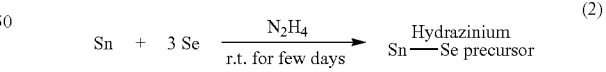

(2)

As the chalcogen, Se or S can be used, and Se is preferable. As Sn, not only a Sn metal, but also Sn selenide ($SnSe$, $SnSe_2$) may be used. As the poor solvent, an alcohol solvent is preferable, and IPA is more preferable. As hydrazine, anhydrous hydrazine may be used, although hydrazine monohydrate or a water-containing hydrazine is preferable. With respect to the amount of Sn and the chalcogen, it is preferable to use 3 mol of the chalcogen, per 1 mol of Sn.

Next, the hydrazine-coordinated Zn chalcogenide complex will be described. The hydrazine-coordinated Zn chalcogenide complex used in this embodiment is required to be generated so as to be soluble in DMSO. The hydrazine-coordinated Zn chalcogenide complex can be generated, for example, by mixing Zn or ZnSe and a chalcogen in the presence of hydrazine to obtain a crude product, followed by extracting the crude product with dimethylsulfoxide.

More specifically, Zn selenide and a chalcogen are added to hydrazine in DMSO, and stirred at room temperature for about 3 to 7 days. Then, hydrazine is removed from the resulting solution while flowing nitrogen to obtain a crude product (reaction intermediate solution). Thereafter, the obtained crude product is extracted with DMSO.

Subsequently, the extraction solution obtained by extracting the crude product is subjected to filtration using, for example, a 0.2 μm PTFE filter, followed by concentration. The resulting concentrated solution is subjected to filtration, thereby obtaining a hydrazine-coordinated Zn chalcogenide complex.

The generation of the hydrazine-coordinated Zn chalcogenide complex described above can be expressed by a chemical formula (3) shown below.

[Chemical Formula 3]

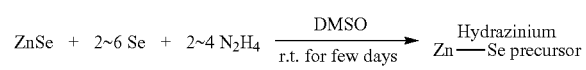

(3)

As the chalcogen, Se or S can be used, and Se is preferable. As Zn, not only Zn selenide, but also Zn metal may be used. As hydrazine, anhydrous hydrazine may be used, although hydrazine monohydrate or a water-containing hydrazine is preferable. Further, as the reaction solvent, hydrazine may be used instead of DMSO. With respect to the amount of Zn selenide (ZnSe) and the chalcogen, it is preferable to use 2 mol or more of the chalcogen, per 1 mol of Zn selenide, and it is more preferable to use 3 to 4 mol of the chalcogen, per 1 mol of Zn selenide.

Method of Producing Coating Solution for Forming CZTS Layer

Next, the method of producing the coating solution for forming a light-absorbing layer will be described.

Firstly, DMSO is added to the aforementioned hydrazine-coordinated Cu chalcogenide complex and stirred at room temperature for about one night, thereby obtaining a DMSO solution having the hydrazine-coordinated Cu chalcogenide complex dissolved therein (first solution).

Further, DMSO is added to the aforementioned hydrazine-coordinated Sn chalcogenide complex and stirred at a temperature of 80 to 120° C. for about 1 hour, thereby obtaining a DMSO solution having the hydrazine-coordinated Sn chalcogenide complex dissolved therein (second solution).

Further, DMSO is added to the aforementioned hydrazine-coordinated Zn chalcogenide complex and stirred at a temperature of 80 to 120° C. for about 1 hour, thereby obtaining a DMSO solution having the hydrazine-coordinated Zn chalcogenide complex dissolved therein (third solution).

Subsequently, the DMSO solution having the hydrazine-coordinated Cu chalcogenide complex dissolved therein, the DMSO solution having the hydrazine-coordinated Sn chalcogenide complex dissolved therein and the DMSO solution having the hydrazine-coordinated Zn chalcogenide complex dissolved therein are mixed together.

In this manner, the coating solution for forming a light-absorbing layer according to the present embodiment can be produced.

In the coating solution for forming a light-absorbing layer according to the present embodiment, for improving the film quality (grain size and crystal quality) of the light absorbing layer, an Na additive solution may be added.

The Na additive solution can be obtained, for example, as follows. 2 equivalents of Se is added to sodium selenide ($Na_2Se$), followed by stirring in DMSO at room temperature for 3 to 1 week, thereby obtaining a homogeneous black solution.

The coating solution for forming a light-absorbing layer according to the present embodiment uses DMSO as the solvent, and the coating solution itself does not contain hydrazine. As a result, the chemical properties (explosiveness) of hydrazine in the formation of a light-absorbing layer would not be of any problems, thereby improving the safety of the production process.

Further, since hydrazine-coordinated metal chalcogenide complexes are uniformly dissolved in the solution, storage stability is increased, and the freedom of the choice of the coating apparatus is improved.

Furthermore, the coating solution for forming a light-absorbing layer according to the present embodiment contains no amines as a dissolution promoter. When amines are used as a dissolution promoter, the amines remain in the device after formation of the film, thereby deteriorating the PV (photovoltaic) performance.

However, in the present invention, amines may be used as a dissolution promoter in a range where the PV performance is not affected.

In the coating solution for forming a light-absorbing layer according to the present embodiment, if desired, a miscible additive may be included as long as the effects of the present invention are not impaired, for example, an organic solvent for adjusting the viscosity, an additive resin for improving the performance of the film, a surfactant for improving the applicability or a stabilizer.

Coating Solution for Forming CIGS Layer

First Embodiment

Hereafter, the coating solution for forming a CIGS layer according to a first mode of the present embodiment will be described.

The coating solution of the present embodiment which is used for forming a CIGS layer of a chalcopyrite solar cell is obtained by dissolving a hydrazine-coordinated Cu chalcogenide complex, a hydrazine-coordinated In chalcogenide complex component and a hydrazine-coordinated Ga chalcogenide complex component in dimethylsulfoxide (DMSO).

The coating solution forming a light-absorbing layer is preferably free of amine solvents.

As the hydrazine-coordinated Cu chalcogenide complex, a hydrazine-coordinated Cu chalcogenide complex obtained by the aforementioned first or second method can be used.

Next, the hydrazine-coordinated In chalcogenide complex will be described. The hydrazine-coordinated In chalcogenide complex used in this embodiment is required to be generated so as to be soluble in DMSO. The hydrazine-coordinated In chalcogenide complex can be generated, for example, by adding In selenide ($In_2Se_3$) and a chalcogen in hydrazine to obtain a crude product (first crude product), extracting the crude product with DMSO, adding a poor solvent to the resulting solution, followed by reprecipitation.

More specifically, In selenide and a chalcogen are added to hydrazine, and stirred at room temperature for about 3 to 7 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter, followed by concentration. Then, a poor solvent is added to the concentration solution to perform a reprecipitation, and the supernatant is removed. The precipitate is washed with IPA and dried, thereby obtaining a dark-red hydrazine-coordinated In chalcogenide complex.

The generation of the hydrazine-coordinated In chalcogenide complex described above can be expressed by a chemical formula (4) shown below.

[Chemical Formula 4]

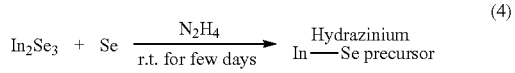

(4)

As the chalcogen, Se or S can be used, and Se is preferable. As In, not only In selenide, but also In metal may be used. As the poor solvent, an alcohol solvent is preferable, and IPA is more preferable. As hydrazine, anhydrous hydrazine may be used, although hydrazine monohydrate is preferable. With respect to the amount of In selenide ($In_2Se_3$) and the chalcogen, it is preferable to use 1 mol or more of the chalcogen, per 1 mol of In selenide.

As described above, in the present embodiment, the hydrazine-coordinated In chalcogenide complex is obtained by extracting with a DMSO solution, followed by reprecipitation. As a result, the thus obtained hydrazine-coordinated In chalcogenide complex exhibits improved solubility in a DMSO solution.

Next, the hydrazine-coordinated Ga chalcogenide complex will be described. The hydrazine-coordinated Ga chalcogenide complex used in this embodiment is required to be generated so as to be soluble in DMSO. The hydrazine-coordinated Ga chalcogenide complex can be generated, for example, by adding Ga metal and a chalcogen in hydrazine to obtain a crude product (a second crude product), extracting the crude product with DMSO, adding a poor solvent to the resulting solution, followed by reprecipitation.

More specifically, Ga metal and a chalcogen are added to hydrazine, and stirred at room temperature for about 7 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter, followed by concentration. Then, a poor solvent is added to the concentration solution to perform a reprecipitation, and the supernatant is removed. The precipitate is washed with IPA and dried, thereby obtaining a dark-brown hydrazine-coordinated Ga chalcogenide complex.

The generation of the hydrazine-coordinated Ga chalcogenide complex described above can be expressed by a chemical formula (5) shown below.

[Chemical Formula 5]

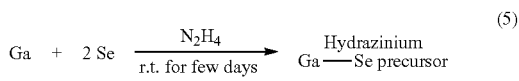

(5)

As the chalcogen, Se or S can be used, and Se is preferable. As the poor solvent, an alcohol solvent is preferable, and IPA is more preferable. As hydrazine, anhydrous hydrazine may be used, although hydrazine monohydrate or a water-containing hydrazine is preferable. With respect to the amount of Ga and the chalcogen, it is preferable to use 2 mol or more of the chalcogen, per 1 mol of Ga.

As described above, in the present embodiment, the hydrazine-coordinated Ga chalcogenide complex is obtained by extracting with a DMSO solution, followed by reprecipitation. As a result, the thus obtained hydrazine-coordinated Ga chalcogenide complex exhibits improved solubility in a DMSO solution.

Next, the method of producing the coating solution for forming a CIGS layer will be described.

Firstly, DMSO is added to the aforementioned hydrazine-coordinated Cu chalcogenide complex and stirred at room temperature for about one night, thereby obtaining a DMSO solution having the hydrazine-coordinated Cu chalcogenide complex dissolved therein (solution (I)).

Further, DMSO is added to the aforementioned hydrazine-coordinated In chalcogenide complex and stirred at a temperature of 80 to 120° C. for about 1 hour, thereby obtaining a DMSO solution having the hydrazine-coordinated In chalcogenide complex dissolved therein (solution (II)).

Furthermore, DMSO is added to the aforementioned hydrazine-coordinated Ga chalcogenide complex and stirred at a temperature of 80 to 120° C. for about 1 hour, thereby obtaining a DMSO solution having the hydrazine-coordinated Ga chalcogenide complex dissolved therein (solution (III)).

Subsequently, the DMSO solution having the hydrazine-coordinated Cu chalcogenide complex dissolved therein, the DMSO solution having the hydrazine-coordinated In chalcogenide complex dissolved therein and the DMSO solution having the hydrazine-coordinated Ga chalcogenide complex dissolved therein are mixed together.

In this manner, the coating solution for forming a light-absorbing layer according to the present embodiment can be produced.

In the coating solution for forming a CIGS layer according to the present embodiment, DMSO is used as the solvent. As a result, the storage stability is improved as compared to a conventional coating solution.

Specifically, when hydrazine is used by a conventional method, a problem arises in that $Cu_2Se$ is precipitated. For example, when hydrazine is used as a solvent, and a solution (I) prepared from $Cu_2S$ and S and a solution (II) prepared from $In_2Se_3$, Ga and Se are mixed together, $Cu_2S$ in the first solution reacts with Se in the second solution to cause the precipitation. The precipitation of $Cu_2S$ was observed after about 2 weeks.

In contrast, the coating solution for forming a light-absorbing layer according to the present embodiment was not deteriorated even after 1 month, meaning that the coating solution exhibited excellent storage stability.

Further, since the coating solution itself does not contain hydrazine, the chemical properties (explosiveness) of hydrazine in the formation of a light-absorbing layer would not be of any problems, thereby improving the safety of the production process.

Furthermore, the coating solution for forming a light-absorbing layer according to the present embodiment contains no amines as a dissolution promoter. As a result, the photovoltaic (PV) performance was improved as compared to conventional coating solutions.

More specifically, when amines are used as a dissolution promoter, the amines remain in the device after formation of the film, thereby deteriorating the PV (photovoltaic) performance. In contrast, since the coating solution for forming a light-absorbing layer according to the present embodiment does not use any amines as a dissolution promoter, the PV performance is not deteriorated.

However, in the present invention, amines may be used as a dissolution promoter in a range where the PV performance is not affected.

In the coating solution for forming a light-absorbing layer according to the present embodiment, if desired, a miscible additive may be included as long as the effects of the present invention are not impaired, for example, an organic solvent for adjusting the viscosity, an additive resin for improving the performance of the film, a surfactant for improving the applicability or a stabilizer.

Second Embodiment

Next, the coating solution for forming a CIGS layer according to a second mode of the present embodiment will be described.

In the present embodiment, the coating solution for forming a light-absorbing layer is prepared from the hydrazine-coordinated Cu chalcogenide complex, the hydrazine-coordinated In chalcogenide complex and the hydrazine-coordinated Ga chalcogenide complex described above in the first embodiment, together with a hydrazine-coordinated Sb chalcogenide complex.

A hydrazine-coordinated Sb chalcogenide complex can be obtained by adding Sb selenide ($Sb_2Se_3$) and a chalcogen to hydrazine to obtain a crude product (a third crude product), extracting the crude product with DMSO, and adding a poor solvent to the resulting solution to perform recrystallization.

More specifically, Sb selenide and a chalcogen are added to hydrazine, and stirred at room temperature for about 3 to 7 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter. Then, a poor solvent is added to the filtrate for reprecipitation, thereby obtaining a black hydrazine-coordinated Sb chalcogenide complex.

The generation of the hydrazine-coordinated Sb chalcogenide complex described above can be expressed by a chemical formula (6) shown below.

[Chemical Formula 6]

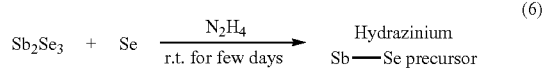

(6)

As the chalcogen, Se or S can be used, and Se is preferable. As the poor solvent, an alcohol solvent is preferable, and IPA is more preferable. As hydrazine, anhydrous hydrazine or a water-containing hydrazine may be used, although hydrazine is preferable. With respect to the amount of Sb selenide ($Sb_2Se_3$) and the chalcogen, it is preferable to use 2 mol or more of the chalcogen, per 1 mol of Sb selenide.

Although the present embodiment is described using Sb selenide, an elemental antimony may also be used instead of Sb selenide. In such a case, with respect to the amount of antimony and the chalcogen, it is preferable to use 4 mol or more of the chalcogen per 1 mol of antimony.

Next, the method of producing the coating solution for forming a CIGS layer according to the present embodiment will be described.

Firstly, DMSO is added to the hydrazine-coordinated Cu chalcogenide complex described in the first embodiment and stirred at room temperature for about one night, thereby obtaining a DMSO solution having the hydrazine-coordinated Cu chalcogenide complex dissolved therein (solution (I')).

Further, DMSO is added to the hydrazine-coordinated In chalcogenide complex and the hydrazine-coordinated Ga chalcogenide complex described in the first embodiment, and stirred at a temperature of 80 to 120° C. for about 1 hour, thereby obtaining a DMSO solution having the hydrazine-coordinated In chalcogenide complex and the hydrazine-coordinated Ga chalcogenide complex dissolved therein (solution (II')).

Furthermore, DMSO is added to the aforementioned hydrazine-coordinated Sb chalcogenide complex, and stirred at room temperature for one night, thereby obtaining a DMSO solution having the hydrazine-coordinated Sb chalcogenide complex dissolved therein.

In addition, 2 equimolar amounts of Se is added to $Na_2Se$, and stirred in DMSO at room temperature for 3 to 7 days, thereby obtaining a uniform solution.

In the present embodiment, Na is used for improving the film quality of the light-absorbing layer (e.g., grain size and crystalline quality), and this Na solution may not be used.

Subsequently, the aforementioned 4 solutions, namely, the DMSO solution having the hydrazine-coordinated Cu chalcogenide complex dissolved therein, the DMSO solution having the hydrazine-coordinated In chalcogenide complex and the hydrazine-coordinated Ga chalcogenide complex dissolved therein, the DMSO solution having the hydrazine-coordinated Sb chalcogenide complex dissolved therein and the Na solution are mixed together.

In this manner, the coating solution for forming a light-absorbing layer according to the present embodiment can be produced.

Like in the first embodiment, the coating solution for forming a light-absorbing layer according to the present embodiment is not deteriorated with time, and exhibits excellent storage stability.

Further, since the coating solution itself does not contain hydrazine, the chemical properties (explosiveness) of hydrazine in the formation of a light-absorbing layer would not be of any problems, thereby improving the safety of the production process.

In addition, since the coating solution for forming a light-absorbing layer according to the present embodiment contains no amines as a dissolution promoter, the PV performance is improved as compared to conventional coating solutions.

However, in the present invention, amines may be used as a dissolution promoter in a range where the PV performance is not affected.

Next, a method of producing a chalcopyrite or CZTS solar cell according to the present embodiment will be described.

The method of producing a chalcopyrite or CZTS solar cell according to the present embodiment mainly includes the steps of forming a first electrode on a substrate, forming a light-absorbing layer on the first electrode, forming a buffer layer on the light-absorbing layer, and forming a second electrode on the buffer layer.

In the method, the steps other than the step of forming a light-absorbing layer on the first electrode can be performed by any conventional method. For example, the step of forming a first electrode on a substrate can be performed by a sputtering method using nitrogen as a sputtering gas, and forming a film layer such as an Mo layer. The buffer layer can be formed as a CdS layer by, for example, a chemical bath deposition method. The second electrode can be formed as a transparent electrode using an appropriate material.

In the formation of a light-absorbing layer, firstly, the aforementioned coating solution for forming a light-absorbing layer is applied to the first electrode (support). The application of the coating solution can be conducted by a spin-coat method, a dip-coat method, a doctor-blade (applicator) method, a curtain-slit cast method, a printing method, a spraying method or the like.

The application conditions can be appropriately selected depending on the desired film thickness, concentration of the materials and the like.

For example, in a spin-coating method, the support is set on a spin coater, followed by applying the coating solution to the support. The application conditions can be appropriately selected depending on the film thickness. For example, the application can be performed at a rotation speed of 300 to 3,000 rpm for 10 to 60 seconds.

In a dipping method, the support can be dipped in a container containing the coating solution. The dipping can be performed once, or a plurality of times.

After applying the coating solution for forming a light-absorbing layer on the support, a vacuum drying may be performed.

Subsequently, after applying the coating solution on the support, the support is baked to form a light-absorbing layer.

The baking conditions can be appropriately selected depending on the desired film thickness, the type of materials used, and the like. For example, the baking can be performed in 2 steps, namely, performing a soft bake on a hot plate (prebake), followed by baking in an oven (annealing).

In such a case, for example, the support may be set and held on a hot plate, followed by raising the temperature of the hot plate to 100 to 500° C. to perform the soft bake for 1 to 30 seconds. Then, the inside of the oven can be heated to 300 to 700° C., and maintained for 1 to 180 minutes to perform the annealing.

As a result, the light-absorbing layer is cured.

The baking temperatures described above are merely one example of the baking conditions, and the baking conditions are not particularly limited. For example, the temperature of the hot plate can be raised in a stepwise manner, and the heating may be performed in an inert gas atmosphere in a glove box.

Thereafter, the film thickness of the light-absorbing layer is measured. When the film thickness is smaller than the desired thickness, the coating solution for forming a light-absorbing layer is applied to the support again and baked. By repeating these steps, a light-absorbing layer having the desired thickness can be obtained.

In the manner as described above, a chalcopyrite solar cell or a CZTS solar cell according to the present embodiment can be produced. Since the chalcopyrite or CZTS solar cell produced by the method of the present embodiment contains no hydrazine in the coating solution, the safety of the production process can be improved. Further, since the coating solution for forming a light-absorbing layer exhibits improved storage stability, limitation on the production process can be reduced.

Hereinabove, the present invention has been explained based on the aforementioned embodiments. Needless to say, the present invention is not limited to the aforementioned embodiments, and various modifications can be made without departing from the spirit or scope of the present invention.

For example, in the second production method, although the crude hydrazine-coordinated Cu chalcogenide complex is obtained by dissolving Cu and a chalcogen in DMSO having hydrazine added thereto, and adding a poor solvent to the resulting solution for recrystallization, the present invention is not limited thereto, and any crude hydrazine-coordinated Cu chalcogenide complex may be used. It would be satisfactory as long as DMSO having a hydrazine-coordinated Cu chalcogenide complex dissolved therein is ultimately prepared. For example, Cu and a chalcogen may be dissolved in DMSO having hydrazine dissolved therein, and the remaining hydrazine may be removed, so as to use the resulting solution.

Nevertheless, the crude hydrazine-coordinated Cu chalcogenide complex obtained by recrystallization as described in the aforementioned embodiments exhibits excellent solubility in DMSO. Therefore, by using this complex, a coating solution for forming a light-absorbing layer with a high precision can be obtained as compared to the conventional methods.

EXAMPLES

As follows is a description of examples of the present invention, although the scope of the present invention is by no way limited by these examples.

Comparative Example 1

Production of Crude Hydrazine-Coordinated Cu Chalcogenide Complex

A metal Cu (383.0 mg, 6.03 mmol) and 4 equivalents of Se (1903.2 mg, 24.10 mmol) were stirred in DMSO (10 ml) at room temperature for 3 days in the presence of 2 equivalents of hydrazine relative to the Cu metal (378 μl, 12.05 mmol). Then, the remaining hydrazine was removed by flowing nitrogen, followed by concentration. Thereafter, the obtained concentrated solution was subjected to filtration using a 0.2 μm PTFE filter, thereby obtaining a crude hydrazine-coordinated Cu—Se chalcogenide complex/DMSO solution (concentration in terms of Cu: 1.298 mol/l) (hereafter, referred to as "solution (a)").

Example 1

Production of Hydrazine-Coordinated Cu Chalcogenide Complex

To the crude hydrazine-coordinated Cu—Se complex/ DMSO solution obtained in Comparative Example 1 was added pure water in an amount that the volume ratio became 1:1, followed by stirring for 10 minutes. The resulting solution was allowed to stand for 30 minutes. As a result, a black precipitate was observed. The resultant was subjected to filtration using a 0.45 μm PTFE filter to remove the black precipitate, and the obtained filtrate was concentrated under reduced pressure to remove pure water, thereby obtaining a hydrazine-coordinated Cu—Se complex/DMSO solution (concentration in terms of Cu: 1.152 mol/l) (hereafter, referred to as "solution (a')").

Example 2

Production of Coating Solution for Forming CZTS Layer (Production of Hydrazine-Coordinated Sn Precursor)

A metal Sn (356 mg, 3.00 mmol) and 3 equivalents of Se (711 mg, 9.00 mmol) were stirred in hydrazine (5 ml) at room temperature for 3 days. Then, the remaining hydrazine was removed by flowing nitrogen, thereby obtaining a crude product. The crude product was extracted with DMSO (80° C., 1 hr), followed by filtering the extract using a 0.2 μm PTFE filter. Subsequently, IPA was added and stirred, thereby precipitating a dark-red product. Then, supernatant was removed, and the precipitate was washed with IPA and dried, thereby obtaining a dark-yellow hydrazine-coordinated Sn—Se complex (concentration in terms of Sn: 0.362 mol/l) (hereafter, referred to as "solution (b)").

(Production of Hydrazine-Coordinated Zn Precursor)

Zinc selenide (ZnSe, 460 mg, 4.02 mmol) and 5 equivalents of Se (1,588 mg, 20.11 mmol) were stirred in DMSO (8 ml) at room temperature for 1 week in the presence of 3 equivalents of hydrazine relative to ZnSe (12.07 mmol). Then, the remaining hydrazine was removed by flowing nitrogen, thereby obtaining a reaction intermediate solution. Subsequently, the reaction intermediate solution was extracted with DMSO at room temperature or under heated conditions (heated condition: 80° C., 1 hr). Then, the extracted liquid was subjected to filtration using a 0.2 μm PTFE filter, followed by concentration under reduced pressure. The obtained concentrated solution was filtered, thereby obtaining a hydrazine-coordinated Zn precursor solution (concentration in terms of Zn: 0.069 mol/l) (hereafter, referred to as "solution (c)").

(Preparation of Na Additive Solution)

2 equivalents of Se (322.8 mg, 4.09 mmol) was added to sodium selenide ($Na_2Se$, 255.4 mg, 2.04 mmol), and stirred in DMSO (10 ml) at room temperature for 1 week, thereby obtaining a homogeneous black solution (concentration in terms of Na: 0.500 mol/l) (hereafter, referred to as "solution (d)").

(Production of Coating Solution for Forming CZTS Layer)

Using the above precursor solutions, the solutions (a'), (b), (c) and (d) were mixed together in metal molar ratios of Cu/(Zn+Sn)=0.76 and Zn/Sn=1.12 to 1.17, followed by concentration or addition of a solvent, thereby obtaining a solution A' having a solid content of 10% by weight.

Comparative Example 2

Production of Comparative Coating Solution for Forming CZTS Layer

Using the above precursor solutions, the solutions (a), (b), (c) and (d) were mixed together in metal molar ratios of Cu/(Zn+Sn)=0.76 and Zn/Sn=1.12 to 1.17, followed by concentration or addition of a solvent, thereby obtaining a solution A having a solid content of 10% by weight.

(Device Evaluation of Solar Cell)

Application of the coating solution was performed by a doctor-blade method, and the baking was performed by conducting a soft bake at 475° C. for 4 minutes, followed by annealing at 630° C. for 10 minutes.

A solar cell was produced so that an Mo layer, a CZTS layer (light-absorbing layer), a CdS layer, an i-ZnO layer, an ITO layer, an Al—Ni layer and an $MgF_2$ layer were laminated on a substrate in this order.

The results of the device evaluation of the produced solar cell are shown in Table 1.

Figure 2:
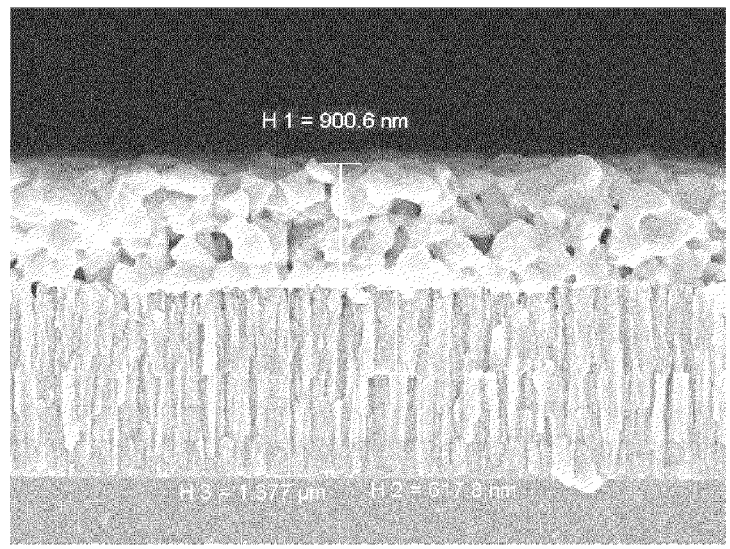
FIG. 2 is a cross-sectional diagram of the CZTS layer formed using the coating solution produced in Example 2, as measured by a scanning electron microscope.
Figure 3:
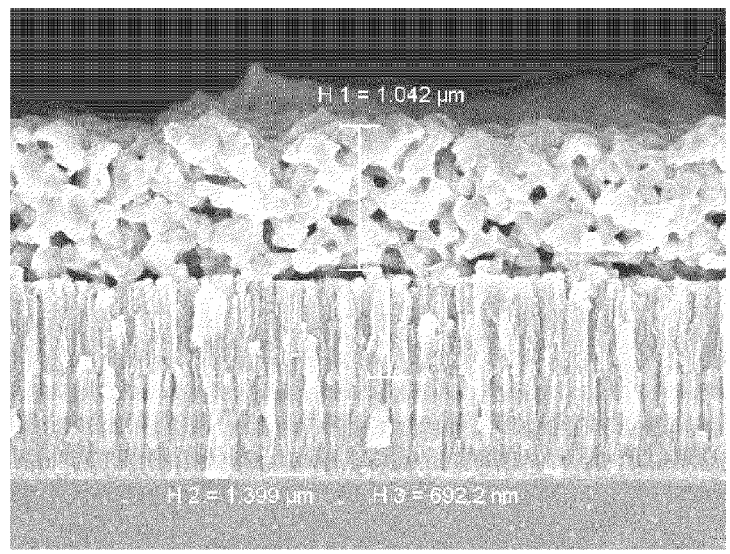
FIG. 3 is a cross-sectional diagram of the CZTS layer formed using the coating solution produced in Comparative Example 2, as measured by a scanning electron microscope.

Further, cross-sectional diagrams of the CZTS layers formed using the coating solutions produced in Example 2 and Comparative Example 2, as measured by a scanning electron microscope (SEM) are shown in FIG. 2 and FIG. 3, respectively.

TABLE 1

| Evaluation conditions | Conversion efficiency (%) | FF (%) | Voc (mV) | Jsc (mA/cm$^2$) | Rs (Ω) | Rsh (Ω) |
|---|---|---|---|---|---|---|
| Example 2 | 4.86 | 62.3 | 602.0 | 13.0 | 1007 | 13 |
| Comparative Example 2 | 2.71 | 46.8 | 481.1 | 12.1 | 571 | 28 |

In Table 1, "FF" indicates the fill factor, which is a value obtained by dividing the maximum power of the solar cell by (open circuit voltage×short-circuit current). Voc indicates the open circuit voltage, which is the voltage obtained when the terminal is opened during irradiation of light, i.e., the maximum voltage of the solar cell. Jsc indicates the short-circuit current, which is the current obtained when the terminal is short-circuited during irradiation of light, i.e., the maximum current of the solar cell. Rs indicates the series resistance, and Rsh indicates the shunt resistance.

From the results shown in Table 1, it was confirmed that, the coating solution for forming a CZTS layer produced in Example 2 which used the hydrazine-coordinated Cu chalcogenide complex of Example 1 having been subjected to a purification process as the Cu component exhibited improved solar cell properties, as compared to the coating solution for forming a CZTS layer produced in Comparative Example 2 which used the hydrazine-coordinated Cu chalcogenide complex of Comparative Example 1 as the Cu component.

Further, from the results shown in FIG. 2 and FIG. 3, it was confirmed that the CZTS layer formed using the coating solution of Example 2 was a homogeneous film, as compared to the CZTS layer formed using the coating solution of Comparative Example 2.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing and purifying a hydrazine-coordinated Cu chalcogenide complex free of an amine solvent, the method comprising:

a step (I) in which Cu or $Cu_2Se$ and a chalcogen are reacted in dimethylsulfoxide in the presence of hydrazine and free of an amine solvent, thereby forming a solution of a hydrazine-coordinated Cu chalcogenide complex;

a step (II) in which hydrazine is removed from the solution obtained in the step (I) under reduced pressure followed by concentration and filtration obtain a filtrate; and a step (III) in which a purifying solvent is added to the filtrate obtained in step (II), thereby removing Se and/or other impurities derived from Cu.

2. The method according to claim 1, wherein the purifying solvent is at least one member selected from the group consisting of water and an alcohol of 1 to 5 carbon atoms.

3. The method according to claim 1, wherein the chalcogen is sulfur or selenium.

4. A method of producing and purifying a hydrazine-coordinated Cu chalcogenide complex free of an amine solvent, the method comprising:

a step (I') in which Cu or $Cu_2Se$ and a chalcogen are reacted in dimethylsulfoxide in the presence of hydrazine and free of an amine solvent, thereby forming a solution of a hydrazine-coordinated Cu chalcogenide complex;

a step (II') in which an alcohol of 1 to 5 carbon atoms is added to the solution obtained in step (I') to precipitate a crude hydrazine-coordinated Cu chalcogenide complex;

a step (III') in which the crude hydrazine-coordinated Cu chalcogenide complex obtained in the step (II') is mixed with dimethylsulfoxide to form a solution; and a step (IV') in which a purifying solvent is added to the solution obtained in step (III'), thereby removing Se and/or other impurities derived from Cu.

5. The method according to claim 4, wherein the purifying solvent is at least one member selected from the group consisting of water and an alcohol of 1 to 5 carbon atoms.

6. The method according to claim 4, wherein the chalcogen is sulfur or selenium.

\* \* \* \* \*